(12) United States Patent
Kato

(10) Patent No.: US 8,481,964 B2
(45) Date of Patent: Jul. 9, 2013

(54) CHARGED PARTICLE BEAM DRAWING APPARATUS AND METHOD

(75) Inventor: Yasuo Kato, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 403 days.

(21) Appl. No.: 12/846,215

(22) Filed: Jul. 29, 2010

(65) Prior Publication Data
US 2011/0033788 A1    Feb. 10, 2011

(30) Foreign Application Priority Data
Aug. 4, 2009 (JP) ............................... 2009-181619

(51) Int. Cl.
G03F 7/20 (2006.01)
H01J 37/304 (2006.01)
H01J 37/317 (2006.01)

(52) U.S. Cl.
USPC ........ 250/398; 250/400; 250/492.22; 430/30; 430/25; 430/24

(58) Field of Classification Search
USPC .......... 250/396 R, 396 ML, 398, 400, 492.1, 250/492.2, 492.21, 492.22, 492.23, 492.3; 430/4, 5, 24, 25, 30, 269, 270, 396
See application file for complete search history.

(56) References Cited

U.S. PATENT DOCUMENTS

| | | | |
|---|---|---|---|
| 5,391,886 A * | 2/1995 | Yamada et al. | 250/492.22 |
| 7,511,290 B2 | 3/2009 | Suzuki et al. | |
| 7,525,110 B2 * | 4/2009 | Suzuki et al. | 250/492.22 |
| 7,589,335 B2 * | 9/2009 | Matsukawa et al. | 250/492.22 |
| 7,740,991 B2 | 6/2010 | Emi et al. | |
| 8,049,190 B2 * | 11/2011 | Komatsu et al. | 250/492.22 |
| 2006/0068301 A1 * | 3/2006 | Hirukawa | 430/5 |
| 2007/0187624 A1 * | 8/2007 | Suzuki et al. | 250/492.22 |
| 2008/0011965 A1 * | 1/2008 | Matsukawa et al. | 250/398 |
| 2009/0032739 A1 | 2/2009 | Kawase | |
| 2009/0242788 A1 * | 10/2009 | Komatsu et al. | 250/396 R |
| 2010/0015537 A1 | 1/2010 | Emi et al. | |

FOREIGN PATENT DOCUMENTS

| | | |
|---|---|---|
| JP | 2007-150243 | 6/2007 |
| JP | 2007-220728 | 8/2007 |
| JP | 2007-258659 | 10/2007 |
| JP | 2009-33025 | 2/2009 |

OTHER PUBLICATIONS

Takayuki Abe, et al. "Global Critical Dimension Correction: I. Fogging Effect Correction", Japanese Journal of Applied Physics, vol. 46, No. 6A, 2007. pp. 3359-3367.

* cited by examiner

Primary Examiner — Bernard E Souw
(74) Attorney, Agent, or Firm — Oblon, Spivak, McClelland, Maier & Neustadt, L.L.P.

(57) ABSTRACT

A charged particle beam drawing apparatus has a drawing chamber including a movable stage which supports a mask, the mask being formed by applying a resist to an upper surface of a mask substrate, an optical column for applying a charged particle beam to draw patterns in the resist, a charged particle beam dose correction portion for correcting a dose of the charged particle beam applied from the optical column to the resist on the basis of proximity effect and fogging effect, and a conversion coefficient changing portion for changing a conversion coefficient on the basis of pattern density in the resist and a position in the resist, wherein the conversion coefficient is a ratio of an accumulation energy of the charged particle beam accumulated in the resist, to an accumulation dose of the charged particle beam accumulated in the resist.

10 Claims, 8 Drawing Sheets

FIG. 1 charged particle beam drawing apparatus 10

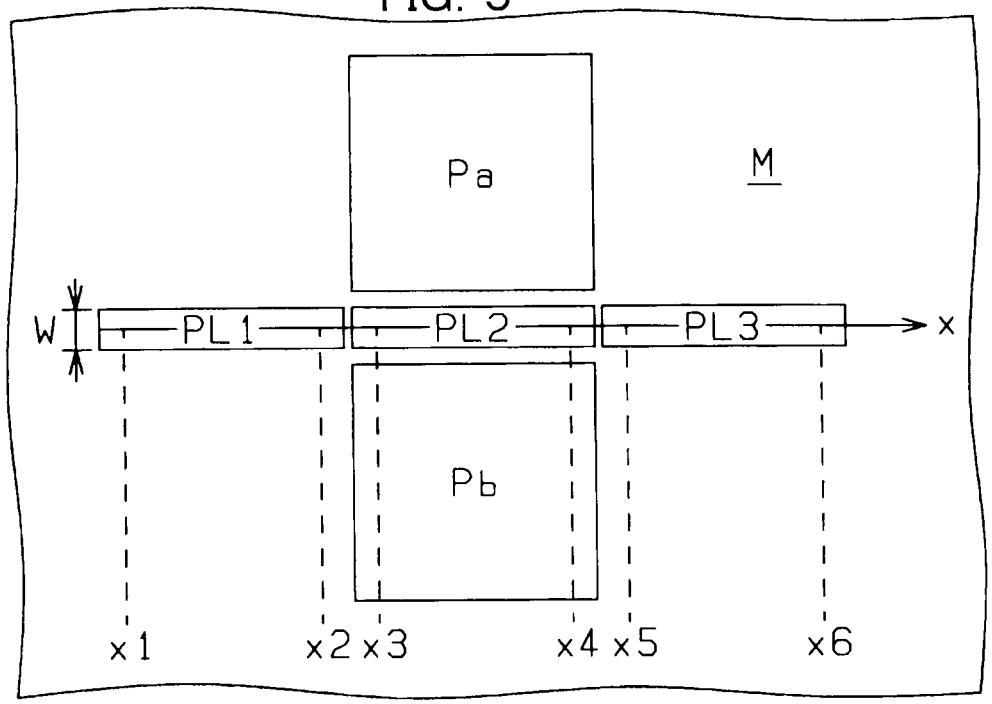

CHARGED PARTICLE BEAM DRAWING APPARATUS AND METHOD

CROSS-REFERENCE TO RELATED APPLICATION

This application is based upon and claims the benefit of priority from the prior Japanese Patent Application No. 2009-181619 filed on Aug. 4, 2009 in Japan, the entire contents of which are incorporated herein by reference.

BACKGROUND OF THE INVENTION

1. Field of the Invention

The present invention relates to a charged particle beam drawing apparatus and method, wherein patterns are drawn by a charged particle beam in a resist which is applied to an upper surface of a mask substrate.

2. Description of Related Art

As is known in the prior art, a charged particle beam drawing apparatus has a drawing chamber including a movable stage which supports a mask. The mask is formed by applying a resist to an upper surface of a mask substrate. In the charged particle beam drawing apparatus in the prior art, a charged particle beam is applied from an optical column to the resist for drawing patterns in the resist, and a dose of the charged particle beam applied from the optical column to the resist is corrected on the basis of proximity effect and fogging effect. For example, the charged particle beam drawing apparatus in the prior art is described in Japanese Unexamined Patent Publication No. 2007-220728.

In the charged particle beam drawing apparatus described in Japanese Unexamined Patent Publication No. 2007-220728, a proximity effect correction dose is calculated on the basis of equations 3, 4 described in Japanese Unexamined Patent Publication No. 2007-220728, and a fogging effect correction dose is calculated on the basis of an equation 15 described in Japanese Unexamined Patent Publication No. 2007-220728. Then, a correction dose of the charged particle beam applied from the optical column to the resist is calculated on the basis of an equation 2 described in Japanese Unexamined Patent Publication No. 2007-220728, the equation 2 multiplies the proximity effect correction dose by the fogging effect correction dose.

An equation 1 described in Japanese Unexamined Patent Publication No. 2007-220728, shows a relation between an accumulation dose of the charged particle beam accumulated in the resist considering proximity effect and fogging effect, and an accumulation energy (absorption amount of the resist) of the charged particle beam accumulated in the resist. In detail, the left side of the equation 1 described in Japanese Unexamined Patent Publication No. 2007-220728, corresponds to the accumulation energy of the charged particle beam accumulated in the resist, and the right side of the equation 1 described in Japanese Unexamined Patent Publication No. 2007-220728, corresponds to the accumulation dose of the charged particle beam accumulated in the resist considering proximity effect and fogging effect.

In the charged particle beam drawing apparatus described in Japanese Unexamined Patent Publication No. 2007-220728, a ratio of the accumulation energy of the charged particle beam accumulated in the resist (which corresponds to the left side of the equation 1 of Japanese Unexamined Patent Publication No. 2007-220728), to the accumulation dose of the charged particle beam accumulated in the resist considering proximity effect and fogging effect (which corresponds to the right side of the equation 1 of Japanese Unexamined Patent Publication No. 2007-220728) is a constant. In detail, the constant is 1 in the equation 1 of Japanese Unexamined Patent Publication No. 2007-220728.

A following equation (1) corresponds to the equation 1 of Japanese Unexamined Patent Publication No. 2007-220728. The equation (1) shows a relation between the accumulation energy of the charged particle beam accumulated in the resist and the accumulation dose of the charged particle beam accumulated in the resist considering proximity effect and fogging effect, in the typical charged particle beam drawing apparatus in the prior art.

$$E(x) = K\left[\frac{D(x)}{2} + \eta \int_A D(x')g_P(x-x')dx' + \theta \int_A D(x')g_F(x-x')dx'\right]$$
$$= C \quad (1)$$

In detail, the equation (1) shows the relation between the accumulation energy $E(x)$ in a position x on a line extending in x axis direction, of the charged particle beam accumulated in the resist, and the accumulation dose of the charged particle beam accumulated in the resist considering proximity effect and fogging effect. The accumulation dose of the charged particle beam accumulated in the resist considering proximity effect and fogging effect, corresponds to a phrase in square brackets [ ] on the right side of the equation (1).

In the equation (1), K is a conversion coefficient from the accumulation dose of the charged particle beam accumulated in the resist, to the accumulation energy $E(x)$ of the charged particle beam accumulated in the resist. That is, K shows a ratio of the accumulation energy $E(x)$ of the charged particle beam accumulated in the resist, to the accumulation dose of the charged particle beam accumulated in the resist. C is a threshold of the accumulation energy $E(x)$ of the charged particle beam accumulated in the resist.

In the equation (1), $D(x)$ shows the dose of the charged particle beam applied from the optical column to the position x in the resist. A left end portion $(D(x)/2)$ in square brackets [ ] on the right side of the equation (1) shows the accumulation dose of the charged particle beam accumulated in the position x in the resist. Namely, the equation (1) means that a half $(D(x)/2)$ of the dose $D(x)$ of the charged particle beam applied from the optical column to the position x in the resist is accumulated in the position x in the resist.

A middle portion in square brackets [ ] on the right side of the equation (1) shows the accumulation dose of the charged particle beam accumulated in the position x in the resist by proximity effect, after the charged particle beam is applied from the optical column to a position x' in a whole drawing area A in the resist. In detail, in the equation (1), $\eta$ shows a proximity effect correction coefficient, and $g_P$ shows a proximity effect influence distribution. In the typical charged particle beam drawing apparatus in the prior art, Gaussian distribution (normal distribution) is used as the proximity effect influence distribution $g_P$.

A right end portion in square brackets [ ] on the right side of the equation (1) shows the accumulation dose of the charged particle beam accumulated in the position x in the resist by fogging effect, after the charged particle beam is applied from the optical column to the position x' in the whole drawing area A in the resist. In detail, in the equation (1), $\theta$ shows a fogging effect correction coefficient, and $g_F$ shows a fogging effect influence distribution. In the typical charged particle beam drawing apparatus in the prior art, Gaussian distribution (normal distribution) is used as the fogging effect influence distribution $g_F$.

In the charged particle beam drawing apparatus, if a base dose of the charged particle beam (see paragraph 0085 of Japanese Unexamined Patent Publication No. 2007-220728) is applied from the optical column to the resist without considering proximity effect and fogging effect, in order to draw linear patterns PL1, PL2, PL3 (see FIG. 5) in the resist of the mask M (see FIG. 5), and to make the width W (see FIG. 5) of the linear patterns PL1, PL2, PL3 uniform, the width W (the vertical axis of the graph in FIG. 6) of the linear pattern PL2 in positions x3, x4 (see FIGS. 5 and 6) around which the pattern density is high, is larger than the width W (the vertical axis of the graph in FIG. 6) of the linear patterns PL1, PL3 in positions x1, x6 (see FIGS. 5 and 6) around which the pattern density is low, under the influence of proximity effect and fogging effect.

Accordingly, in the charged particle beam drawing apparatus in the prior art, the accumulation dose of the charged particle beam accumulated in the resist (in square brackets [ ] on the right side of the equation (1)) in each position, such as positions x1, x2, x3, x4, x5, x6 (see FIGS. 5 and 6) is adjusted so as to make the width W (the vertical axis of the graph in FIG. 6) of the linear pattern PL2 in the positions x3, x4 (see FIGS. 5 and 6) around which the pattern density is high, and the width W (the vertical axis of the graph in FIG. 6) of the linear patterns PL1, PL3 in the positions x1, x6 (see FIGS. 5 and 6) around which the pattern density is low, equal.

In detail, in the charged particle beam drawing apparatus in the prior art, the conversion coefficient K in the equation (1) is not changed, but is a constant, and the accumulation dose of the charged particle beam accumulated in the resist (in square brackets [ ] on the right side of the equation (1)) in each position x, such as the positions x1, x2, x3, x4, x5, x6 (see FIGS. 5 and 6) is adjusted, so as to make a value of the accumulation energy E(x) of the charged particle beam accumulated in the resist (on the right side of the equation (1)) equal to the threshold C.

The inventor's studies show that if the patterns PL1, PL2, PL3 (see FIG. 5) are drawn in the resist of one type of mask, the width W (the vertical axis of the graph in FIG. 6) of the linear pattern PL2 in the positions x3, x4 (see FIGS. 5 and 6) around which the pattern density is high, and the width W (the vertical axis of the graph in FIG. 6) of the linear patterns PL1, PL3 in the positions x1, x6 (see FIGS. 5 and 6) around which the pattern density is low, can be made equal, by adjusting the accumulation dose of the charged particle beam accumulated in the resist (in square brackets [ ] on the right side of the equation (1)) in each position x, such as the positions x1, x2, x3, x4, x5, x6 (see FIGS. 5 and 6). Namely, the inventor's studies show that critical dimension (CD) uniformity of the type of mask can be improved. However, the inventor's studies show that if the patterns PL1, PL2, PL3 (see FIG. 5) are drawn in the resist of another type of mask, it is difficult to make the width W (the vertical axis of the graph in FIGS. 7 and 8) of the linear pattern PL2 in the positions x3, x4 (see FIGS. 5, 7 and 8) around which the pattern density is high, and the width W (the vertical axis of the graph in FIGS. 7 and 8) of the linear patterns PL1, PL3 in the positions x1, x6 (see FIGS. 5, 7 and 8) around which the pattern density is low, equal by adjusting the accumulation dose of the charged particle beam accumulated in the resist (in square brackets [ ] on the right side of the equation (1)) in each position x, such as the positions x1, x2, x3, x4, x5, x6 (see FIGS. 5, 7 and 8).

SUMMARY OF THE INVENTION

An object of the present invention is to provide an charged particle beam drawing apparatus and method which can improve critical dimension uniformity of different type of masks.

In detail, the object of the present invention is to provide the charged particle beam drawing apparatus and method which can improve critical dimension uniformity of different type of masks rather than the charged particle beam drawing apparatus and method wherein the conversion coefficient which is the ratio of the accumulation energy of the charged particle beam accumulated in the resist to the accumulation dose of the charged particle beam accumulated in the resist, is a constant.

In accordance with one aspect of the present invention, a charged particle beam drawing apparatus, comprising: a drawing chamber including a movable stage which supports a mask, the mask being formed by applying a resist to an upper surface of a mask substrate; an optical column for applying a charged particle beam to draw patterns in the resist; a charged particle beam dose correction portion for correcting a dose of the charged particle beam applied from the optical column to the resist on the basis of proximity effect and fogging effect; and a conversion coefficient changing portion for changing a conversion coefficient on the basis of pattern density in the resist and a position in the resist, wherein the conversion coefficient is a ratio of an accumulation energy of the charged particle beam accumulated in the resist, to an accumulation dose of the charged particle beam accumulated in the resist is provided.

In accordance with another aspect of the present invention, a charged particle beam drawing method, for drawing patterns in a resist of a mask by applying a charged particle beam from an optical column to the resist of the mask, the mask being formed by applying the resist to an upper surface of a mask substrate, comprising: placing the mask on a movable stage in a drawing chamber; and changing a conversion coefficient which is a ratio of an accumulation energy of the charged particle beam accumulated in the resist, to an accumulation dose of the charged particle beam accumulated in the resist, on the basis of pattern density in the resist and a position in the resist, if the dose of the charged particle beam applied from the optical column to the resist is corrected on the basis of proximity effect and fogging effect is provided.

Other and further objects, features and advantages of the invention will appear more fully from the following description.

BRIEF DESCRIPTION OF THE DRAWINGS

FIG. 5 schematically shows an example of linear test patterns PL1, PL2, PL3, which are drawn in the resist of a test mask M in order to decide values of parameters, such as fogging effect correction coefficient 6, which are necessary for the charged particle beam dose correction portion 10b1a to correct the dose of the charged particle beam 10a1b;

DETAILED DESCRIPTION OF THE INVENTION

Figure 1:
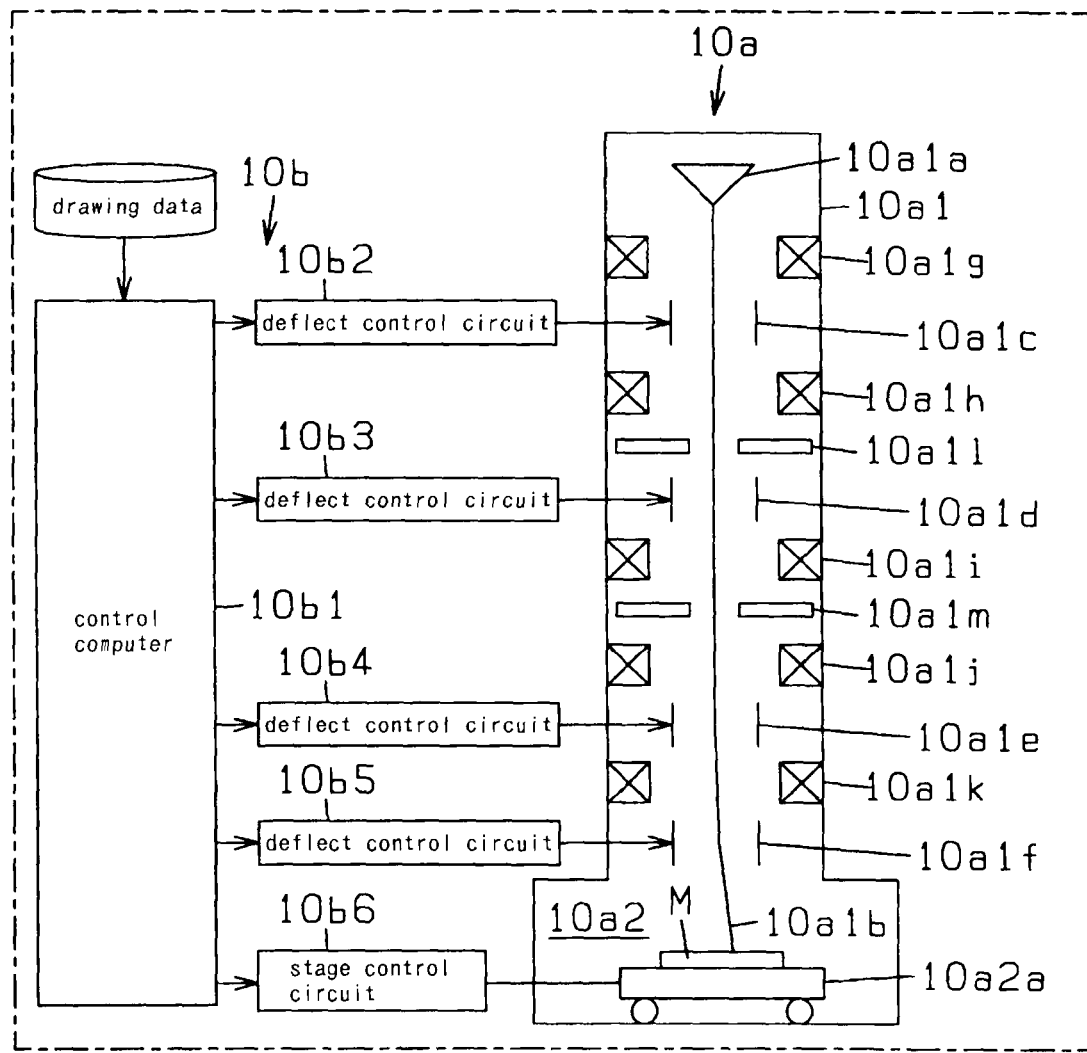
FIG. 1 is a schematic illustration of a first embodiment of a charged particle beam drawing apparatus 10 according to the present invention.
Figure 2:
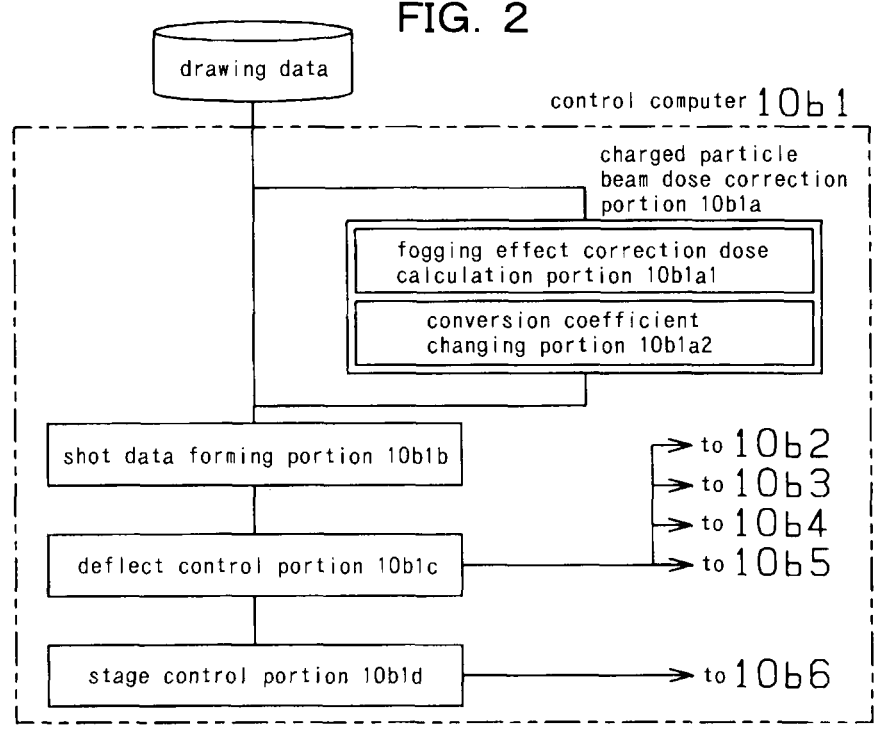
FIG. 2 shows a control computer 10b1 of a control portion 10b of the charged particle beam drawing apparatus 10 of the first embodiment shown in FIG. 1, in detail.

FIG. 1 is a schematic illustration of a first embodiment of a charged particle beam drawing apparatus 10 according to the present invention. FIG. 2 shows a control computer 10b1 of a control portion 10b of the charged particle beam drawing apparatus 10 of the first embodiment shown in FIG. 1, in detail. As shown in FIG. 1, the charged particle beam drawing apparatus 10 of the first embodiment has a drawing portion 10a for drawing patterns in a resist of a mask M by irradiating the mask M with a charged particle beam 10a1b, wherein the mask M is formed by applying the resist to an upper surface of a mask substrate.

In the charged particle beam drawing apparatus 10 of the first embodiment, an electron beam is used as the charged particle beam 10a1b. In the charged particle beam drawing apparatus 10 of a second embodiment, a charged particle beam such as an ion beam, except the electron beam can be used as the charged particle beam 10a1b.

In the charged particle beam drawing apparatus 10 of the first embodiment, as shown in FIG. 1, the drawing portion 10a has a charged particle beam gun 10a1a, deflectors 10a1c, 10a1d, 10a1e, 10a1f for deflecting the charged particle beam 10a1b emitted from the charged particle beam gun 10a1a, and a movable stage 10a2a for supporting the mask M. Patterns are drawn on the mask M by the charged particle beam 10a1b deflected by the deflectors 10a1c, 10a1d, 10a1e, 10a1f.

In the charged particle beam drawing apparatus 10 of the first embodiment, as shown in FIG. 1, a drawing chamber 10a2 composes a part of the drawing portion 10a. The movable stage 10a2a for supporting the mask M is placed in the drawing chamber 10a2. The stage 10a2a is movable in x axis (see FIG. 5) direction and movable in y axis (not shown) direction, y axis direction is perpendicular to x axis direction.

In the charged particle beam drawing apparatus 10 of the first embodiment, as shown in FIG. 1, an optical column 10a1 composes a part of the drawing portion 10a. The charged particle beam gun 10a1a, the deflectors 10a1c, 10a1d, 10a1e, 10a1f, lenses 10a1g, 10a1h, 10a1i, 10a1j, 10a1k, a first forming aperture member 10a1l and a second forming aperture member 10a1m are placed in the optical column 10a1.

In detail, in the charged particle beam drawing apparatus 10 of the first embodiment, as shown in FIGS. 1 and 2, a drawing data inputted to the control computer 10b1 can be directly transferred to a shot data forming portion 10b1b, without being transferred through a charged particle beam dose correction portion 10b1a. In the charged particle beam drawing apparatus 10 of the first embodiment, if the drawing data is directly transferred to the shot data forming portion 10b1b without being transferred through the charged particle beam dose correction portion 10b1a, the base dose of the charged particle beam 10a1b (see paragraph 0085 of Japanese Unexamined Patent Publication No. 2007-220728) is applied from the optical column 10a1 to the resist of the mask M, in order to draw patterns in the resist of the mask M, wherein the patterns correspond to figures (see FIG. 3 of Japanese Unexamined Patent Publication No. 2009-88313) included in the drawing data.

In the charged particle beam drawing apparatus 10 of the first embodiment, as shown in FIGS. 1 and 2, the drawing data inputted to the control computer 10b1 can be transferred through the charged particle beam dose correction portion 10b1a to the shot data forming portion 10b1b. In the charged particle beam drawing apparatus 10 of the first embodiment, if the drawing data is transferred through the charged particle beam dose correction portion 10b1a to the shot data forming portion 10b1b, the charged particle beam 10a1b is applied from the optical column 10a1 to the resist of the mask M in order to draw the patterns corresponding to the figures included in the drawing data, in the resist of the mask M, wherein the dose of the charged particle beam 10a1b is corrected by the charged particle beam dose correction portion 10b1a.

In the charged particle beam drawing apparatus 10 of the first embodiment, as shown in FIGS. 1 and 2, shot data for irradiating the mask M with the charged particle beam 10a1b is formed by the shot data forming portion 10b1b, in order to draw patterns in the resist of the mask M.

In the charged particle beam drawing apparatus 10 of the first embodiment, as shown in FIGS. 1 and 2, the shot data is transferred to a deflect control portion 10b1c. Then, the deflectors 10a1c, 10a1d, 10a1e, 10a1f are controlled by the deflect control portion 10b1c on the basis of the shot data. Accordingly, the charged particle beam 10a1b emitted from the charged particle beam gun 10a1a is applied to a predetermined position in the resist of the mask M.

In detail, in the charged particle beam drawing apparatus 10 of the first embodiment, as shown in FIGS. 1 and 2, the charged particle beam 10a1b emitted from the charged particle beam gun 10a1a is passed through an opening 10a1l' (see FIG. 3) of the first forming aperture member 10a1l and the mask M is irradiated with the charged particle beam 10a1b, or the charged particle beam 10a1b emitted from the charged particle beam gun 10a1a is interrupted by a part of the first forming aperture member 10a1l except the opening 10a1l' and the mask M is not irradiated with the charged particle beam 10a1b, by controlling a blanking deflector 10a1c via a deflect control circuit 10b2 by means of the deflect control portion 10b1c on the basis of the shot data formed by the shot data forming portion 10b1b of the control computer 10b1 of the control portion 10b. In other words, in the charged particle beam drawing apparatus 10 of the first embodiment, dose (beam irradiate time) of the charged particle beam 10a1b can be controlled by controlling the blanking deflector 10a1c.

In the charged particle beam drawing apparatus 10 of the first embodiment, as shown in FIGS. 1 and 2, a beam size changing deflector 10a1d is controlled via a deflect control circuit 10b3 by the deflect control portion 10b1c on the basis of the shot data formed by the shot data forming portion 10b1b of the control computer 10b1 of the control portion 10b, so that the charged particle beam 10a1b passed through the opening 10a1l' (see FIG. 3) of the first forming aperture member 10a1l is deflected by the beam size changing deflector 10a1d. And then, a part of the charged particle beam 10a1b deflected by the beam size changing deflector 10a1d is passed through an opening 10a1m' (see FIG. 3) of the second forming aperture member 10a1m. In other words, in the charged particle beam drawing apparatus 10 of the first embodiment, size or shape of the charged particle beam $10a1b$ applied to the resist of the mask M can be adjusted by adjusting deflecting amount or deflecting direction of the charged particle beam $10a1b$ deflected by the beam size changing deflector $10a1d$.

Figure 3:
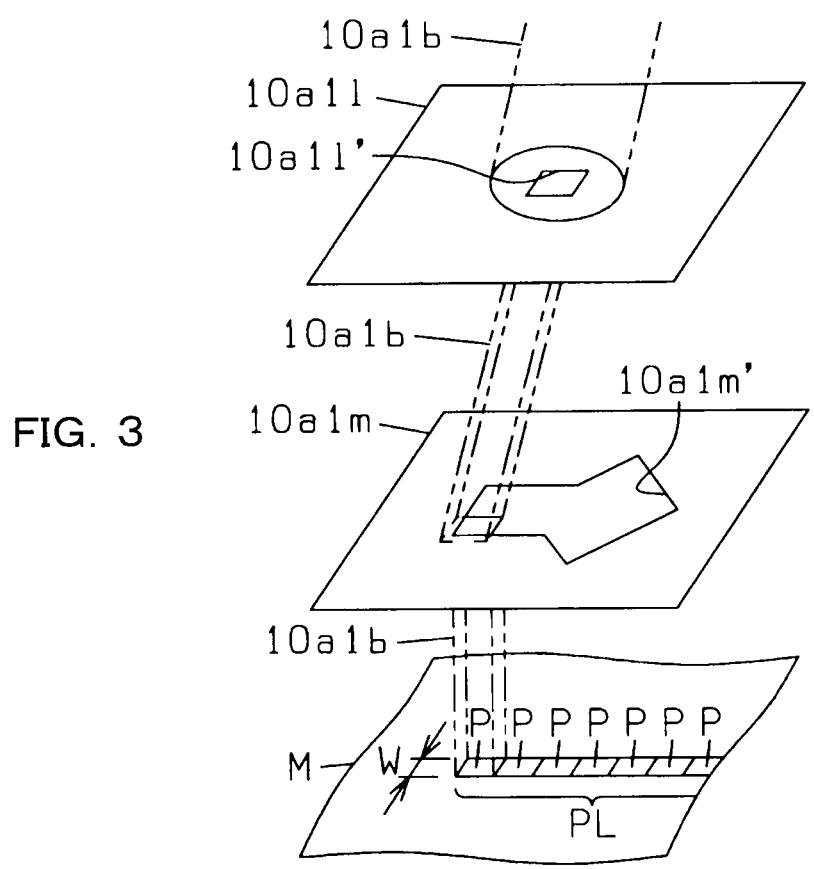
FIG. 3 shows an example of a pattern P which can be drawn in the resist of the mask M by a shot of the charged particle beam 10a1b in the charged particle beam drawing apparatus 10 of the first embodiment.

FIG. 3 shows an example of a pattern P which can be drawn in the resist of the mask M by a shot of the charged particle beam $10a1b$ in the charged particle beam drawing apparatus 10 of the first embodiment. In the charged particle beam drawing apparatus 10 of the first embodiment, as shown in FIGS. 1 and 3, when the pattern P (see FIG. 3) is drawn in the resist of the mask M by the charged particle beam $10a1b$, a part of the charged particle beam $10a1b$ emitted from the charged particle beam gun $10a1a$ (see FIG. 1) is passed through the square opening $10a1l'$ (see FIG. 3) of the first forming aperture member $10a1l$. So that, a horizontal sectional shape of the charged particle beam $10a1b$ passed through the opening $10a1l'$ of the first forming aperture member $10a1l$ is almost square. And then, a part of the charged particle beam $10a1b$ passed through the opening $10a1l'$ of the first forming aperture member $10a1l$ is passed through the opening $10a1m'$ (see FIG. 3) of the second forming aperture member $10a1m$.

In the charged particle beam drawing apparatus 10 of the first embodiment, as shown in FIGS. 1 and 3, a horizontal sectional shape of the charged particle beam $10a1b$ passed through the opening $10a1m'$ (see FIG. 3) of the second forming aperture member $10a1m$ can be rectangular (square or oblong) or triangular, by deflecting the charged particle beam $10a1b$ passed through the opening $10a1l'$ of the first forming aperture member $10a1l$ by means of the deflector $10a1d$ (see FIG. 1).

In the charged particle beam drawing apparatus 10 of the first embodiment, as shown in FIGS. 1 and 3, the pattern P (see FIG. 3) having the same shape as the horizontal sectional shape of the charged particle beam $10a1b$ passed through the opening $10a1m'$ (see FIG. 3) of the second forming aperture member $10a1m$ can be drawn in the resist of the mask M, by applying the charged particle beam $10a1b$ passed through the opening $10a1m'$ (see FIG. 3) of the second forming aperture member $10a1m$ to a predetermined position in the resist of the mask M for a predetermined time, namely by applying a predetermined dose of the charged particle beam $10a1b$ to the predetermined position in the resist of the mask M.

Namely, in the charged particle beam drawing apparatus 10 of the first embodiment, as shown in FIGS. 1 and 3, deflecting amount and deflecting direction of the charged particle beam $10a1b$ passed through the opening $10a1l'$ (see FIG. 3) of the first forming aperture member $10a1l$ and then deflected by the deflector $10a1d$ (see FIG. 1), is controlled by the deflect control portion $10b1c$, so that the square pattern P (see FIG. 3) can be drawn in the resist of the mask M by a shot of the charged particle beam $10a1b$.

In the charged particle beam drawing apparatus 10 of the first embodiment, as shown in FIG. 3, a linear pattern PL having a width W can be drawn in the resist of the mask M by a plurality of shots, wherein each shot of the charged particle beam $10a1b$ can draw the square pattern P.

In the charged particle beam drawing apparatus 10 of the first embodiment, as shown in FIGS. 1 and 2, a main deflector $10a1e$ is controlled via a deflect control circuit $10b4$ by the deflect control portion $10b1c$ on the basis of the shot data formed by the shot data forming portion $10b1b$ of the control computer $10b1$ of the control portion $10b$, so that the charged particle beam $10a1b$ passed through the opening $10a1m'$ (see FIG. 3) of the second forming aperture member $10a1m$ is deflected by the main deflector $10a1e$.

In the charged particle beam drawing apparatus 10 of the first embodiment, as shown in FIGS. 1 and 2, a sub-deflector $10a1f$ is controlled via a deflect control circuit $10b5$ by the deflect control portion $10b1c$ on the basis of the shot data formed by the shot data forming portion $10b1b$ of the control computer $10b1$ of the control portion $10b$, so that the charged particle beam $10a1b$ deflected by the main deflector $10a1e$ is deflected by the sub-deflector) $10a1f$. In the charged particle beam drawing apparatus 10 of the first embodiment, the irradiate position of the charged particle beam $10a1b$ in the resist of the mask M can be adjusted by adjusting deflecting amount and deflecting direction of the charged particle beam $10a1b$ by means of the main deflector $10a1e$ and the sub-deflector $10a1f$.

In the charged particle beam drawing apparatus 10 of the first embodiment, as shown in FIGS. 1 and 2, movement of the movable stage $10a2a$ is controlled via a stage control circuit $10b6$ by a stage control portion $10b1d$ on the basis of the shot data formed by the shot data forming portion $10b1b$ of the control computer $10b1$ of the control portion $10b$.

Figure 4A:
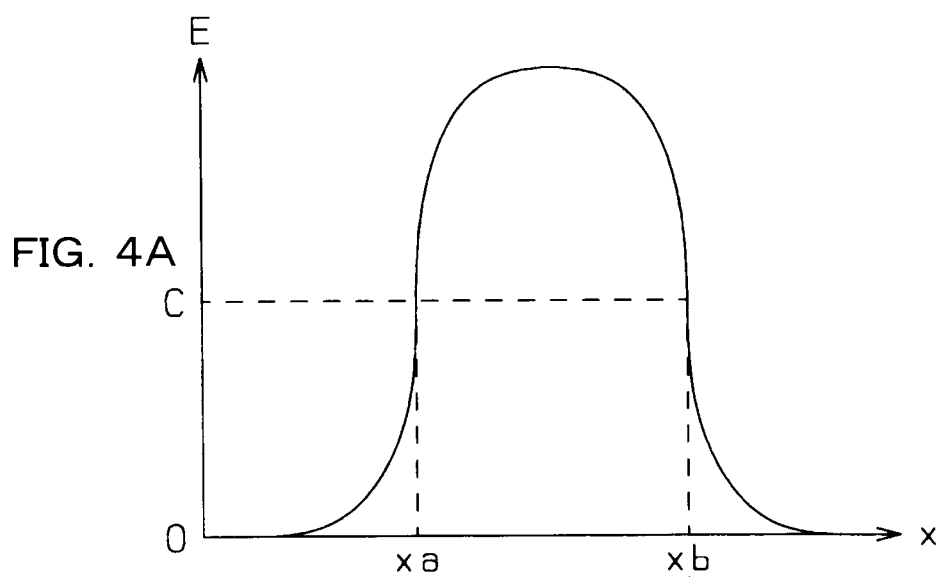
FIGS. 4A and 4B show a relation between the accumulation energy E of the charged particle beam 10a1b accumulated in the resist of the mask M and the pattern P drawn in the resist of the mask M.
Figure 4B:
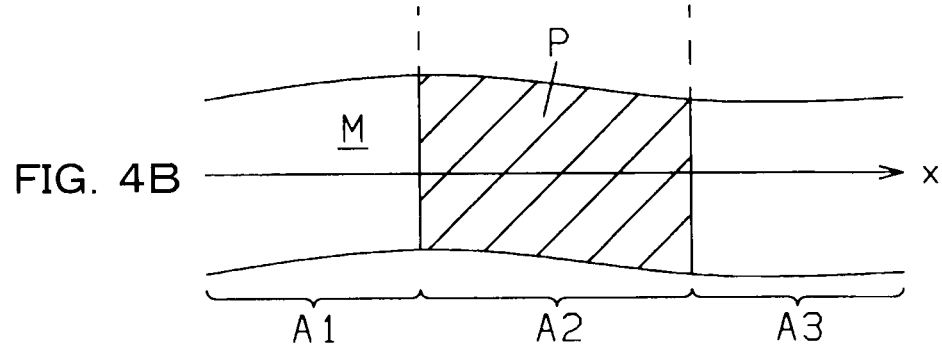

FIGS. 4A and 4B show a relation between the accumulation energy E of the charged particle beam $10a1b$ accumulated in the resist of the mask M and the pattern P drawn in the resist of the mask M. In detail, FIG. 4A shows the accumulation energy E of the charged particle beam $10a1b$ (see FIGS. 1 and 3) accumulated on x axis (see FIG. 4B) in the resist of the mask M. FIG. 4B shows area A1, A3 in the resist of the mask M where the pattern P is not drawn by the charged particle beam $10a1b$, and area A2 in the resist of the mask M where the pattern P is drawn by the charged particle beam $10a1b$.

In case of the mask M applied to the charged particle beam drawing apparatus 10 of the first embodiment, as shown in FIGS. 4A and 4B, the pattern P is not drawn by the charged particle beam $10a1b$ (see FIGS. 1 and 3) in the area A1, A3 on x axis in the resist of the mask M, wherein the accumulation energy E of the charged particle beam $10a1b$ (see FIGS. 1 and 3) accumulated in the area A1 (x<xa), A3 (xb<x) on x axis (see FIG. 4B) in the resist of the mask M, is smaller than a threshold C. The pattern P is drawn by the charged particle beam $10a1b$ (see FIGS. 1 and 3) in the area A2 on x axis in the resist of the mask M, wherein the accumulation energy E of the charged particle beam $10a1b$ (see FIGS. 1 and 3) accumulated in the area A2 on x axis (see FIG. 4B) in the resist of the mask M, is equal to the threshold C or larger than the threshold C, and wherein x is equal to xa or larger than xa, and x is equal to xb or smaller than xb).

FIG. 5 schematically shows an example of linear test patterns PL1, PL2, PL3, which are drawn in the resist of a test mask M in order to decide values of parameters, such as fogging effect correction coefficient θ, which are necessary for the charged particle beam dose correction portion $10b1a$ to correct the dose of the charged particle beam $10a1b$.

In the example shown in FIG. 5, patterns Pa, Pb are drawn in the resist of the test mask M by the charged particle beam $10a1b$ (see FIGS. 1 and 3), so that the pattern density is high around positions x3, x4 on x axis in the resist of the test mask M (in detail, so that the pattern density is 100% around the positions x3, x4). The pattern density is low around positions x1, x2 on x axis in the resist of the test mask M (in detail, the pattern density is 0% around the positions x1, x2). The pattern density is low around positions x5, x6 on x axis in the resist of the test mask M (in detail, the pattern density is 0% around the positions x5, x6).

In the example shown in FIG. 5, the base dose (see paragraph 0085 of Japanese Unexamined Patent Publication No. 2007-220728) of the charged particle beam $10a1b$ (see FIGS.

1 and 3) is applied from the optical column 10a1 (see FIG. 1) to positions on x axis in the resist of the test mask M, and the linear test patterns PL1, PL2, PL3 are drawn. In detail, the width W of the linear test patterns PL1, PL2, PL3 are aimed at a target width Wt (see FIG. 6), and the linear test patterns PL1, PL2, PL3 are drawn by the base dose of the charged particle beam 10a1b, without the dose of the charged particle beam 10a1b being corrected by the charged particle beam dose correction portion 10b1a (see FIG. 2).

Figure 6:
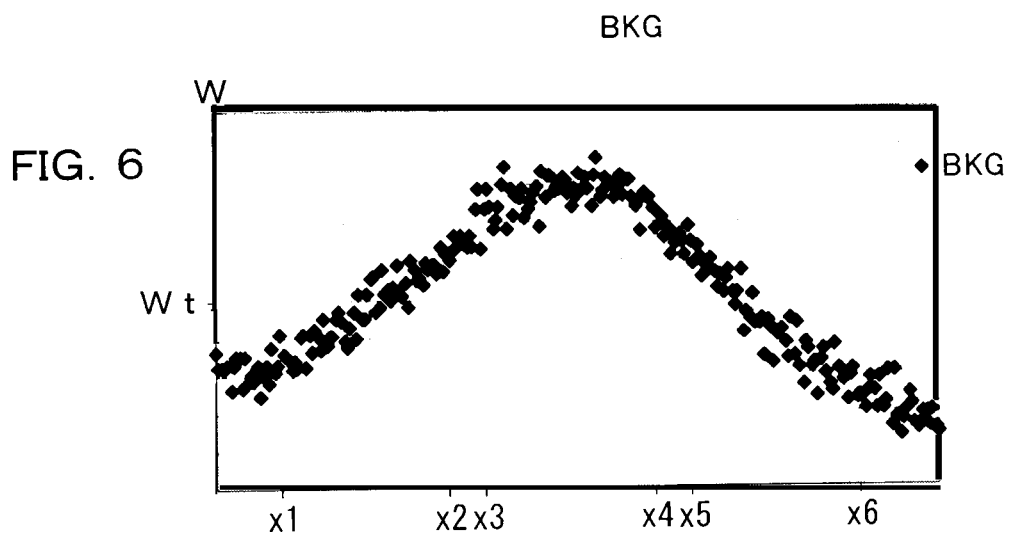
FIG. 6 shows measurement values of the width W of the linear test patterns PL1, PL2, PL3 which are drawn in the resist of a first type of mask M.

FIG. 6 shows measurement values of the width W of the linear test patterns PL1, PL2, PL3 (see FIG. 5) which are drawn in the resist of a first type of mask M. Positions x1, x2, x3, x4, x5, x6 on horizontal axis of the graph shown in FIG. 6 schematically correspond to the positions x1, x2, x3, x4, x5, x6 on x axis in FIG. 5. The width W of the linear test patterns PL1, PL2, PL3 drawn in the resist of the mask M can be measured by a SEM (scanning electron microscope).

In the example shown in FIGS. 5 and 6, the width W of the linear test pattern PL1 in the position x1, and the width W of the linear test pattern PL3 in the position x6 have a tendency to be smaller than the target width Wt, under the influence of self proximity effect of the linear test patterns PL1, PL3. The width W of the linear test pattern PL2 in the positions x3, x4 has a tendency to be larger than the target width Wt, under the influence of mutual proximity effect between the pattern PL2 and the patterns Pa, Pb, and under the influence of fogging effect of the charged particle beam 10a1b which draws the patterns Pa, Pb.

Figure 7:
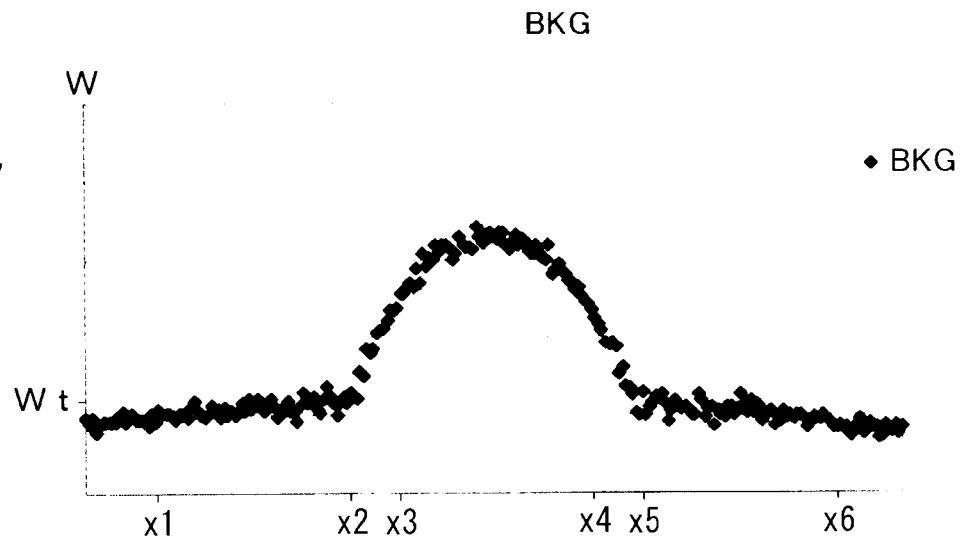
FIG. 7 shows measurement values of the width W of the linear test patterns PL1, PL2, PL3 which are drawn in the resist of a second type of mask M.
Figure 8:
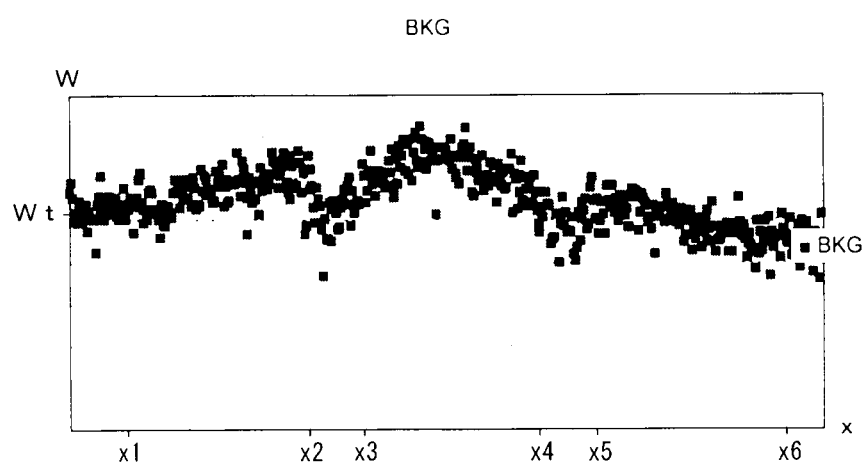
FIG. 8 shows measurement values of the width W of the linear test patterns PL1, PL2, PL3 which are drawn in the resist of a third type of mask M.

FIG. 7 shows measurement values of the width W of the linear test patterns PL1, PL2, PL3 (see FIG. 5) which are drawn in the resist of a second type of mask M. FIG. 8 shows measurement values of the width W of the linear test patterns PL1, PL2, PL3 (see FIG. 5) which are drawn in the resist of a third type of mask M.

The second and third type of masks M are not applied to the charged particle beam drawing apparatus in the prior art, but the first type of mask M is applied to the charged particle beam drawing apparatus in the prior art. Consequently, in the charged particle beam drawing apparatus in the prior art, the dose of the charged particle beam 10a1b (see FIG. 1) applied from the optical column 10a1 (see FIG. 1) to the resist of the first type of mask M is corrected, so that a curve of the width W in the graph in FIG. 6 is changed to a horizontal line which corresponds to the target width Wt (see FIG. 6).

In detail, in the charged particle beam drawing apparatus in the prior art, actual width W of the linear test patterns PL1, PL2, PL3 (see FIG. 5) drawn in the resist of the first type of mask M can correspond to the target width Wt (see FIG. 6) by adjusting the right end portion in square brackets [ ] on the right side of the equation (1), even if the conversion coefficient K in the equation (1) is constant. Namely, in the charged particle beam drawing apparatus in the prior art, the actual width W of the linear test patterns PL1, PL2, PL3 (see FIG. 5) drawn in the resist of the first type of mask M can correspond to the target width Wt (see FIG. 6) by adjusting the accumulation dose of the charged particle beam 10a1b accumulated in the position x in the resist of the first type of mask M by fogging effect (the right end portion in square brackets [ ] on the right side of the equation (1)) after the charged particle beam 10a1b is applied from the optical column 10a1 (see FIG. 1) to a position x' in a whole drawing area A in the resist of the first type of mask M, even if the conversion coefficient K in the equation (1) is constant.

The inventor's studies show that the width W (the vertical axis of the graph in FIG. 6) of the linear pattern PL2 (see FIG. 5) in the positions x3, x4 (see FIGS. 5 and 6) around which the pattern density is high, and the width W (the vertical axis of the graph in FIG. 6) of the linear patterns PL1, PL3 (see FIG. 5) in the positions x1, x6 (see FIGS. 5 and 6) around which the pattern density is low, can be made equal by adjusting the accumulation dose of the charged particle beam 10a1b accumulated in each position x, such as the positions x1, x2, x3, x4, x5, x6 (see FIGS. 5 and 6), in the resist of the first type of mask M (in square brackets [ ] on the right side of the equation (1)), wherein the linear patterns PL1, PL2, PL3 are drawn in the resist of the first type of mask M. Namely, the inventor's studies show that critical dimension (CD) uniformity of the first type of mask M can be improved. However, the inventor's studies show that it is difficult to make the width W (the vertical axis of the graph in FIGS. 7 and 8) of the linear pattern PL2 (see FIG. 5) in the positions x3, x4 (see FIGS. 5, 7 and 8) around which the pattern density is high, and the width W (the vertical axis of the graph in FIGS. 7 and 8) of the linear patterns PL1, PL3 (see FIG. 5) in the positions x1, x6 (see FIGS. 5, 7 and 8) around which the pattern density is low, equal by adjusting the accumulation dose of the charged particle beam 10a1b accumulated in each position x, such as the positions x1, x2, x3, x4, x5, x6 (see FIGS. 5, 7 and 8), in the resist of the second and third type of mask M (in square brackets [ ] on the right side of the equation (1)), wherein the linear patterns PL1, PL2, PL3 are drawn in the resist of the second and third type of mask M.

Accordingly, in the charged particle beam drawing apparatus 10 of the first embodiment, a following improvements are included, so that not only the first type of mask M but also different type of mask M, such as the second and third type of masks M, can be applied to the charged particle beam drawing apparatus 10 of the first embodiment. Namely, in the charged particle beam drawing apparatus 10 of the first embodiment, the following improvements are included, so that not only the critical dimension uniformity of the first type of mask M, but also the critical dimension uniformity of the different type of mask M, such as the second and third type of masks M, can be improved.

In detail, in the charged particle beam drawing apparatus 10 of the first embodiment, as shown in FIG. 2, the charged particle beam dose correction portion 10b1a for correcting the dose of the charged particle beam 10a1b (see FIG. 1) applied from the optical column 10a1 (see FIG. 1) to the resist of the mask M, such as the first type of mask M, the second type of mask M, and the third type of mask M on the basis of proximity effect and fogging effect, is provided with the control computer 10b1. In the charged particle beam drawing apparatus 10 of the first embodiment, the charged particle beam dose correction portion 10b1a has a conversion coefficient changing portion 10b1a2 for changing a conversion coefficient K'(U(x), x) on the basis of the pattern density in the resist and the position x in the resist, wherein the conversion coefficient K'(U(x), x) is a ratio of the accumulation energy E(x) of the charged particle beam 10a1b accumulated in the resist, to the accumulation dose of the charged particle beam 10a1b accumulated in the resist (in square brackets [ ] on the right side of a following equation (2)).

The following equation (2) shows a relation between the accumulation energy E(x) of the charged particle beam 10a1b accumulated in the resist and the accumulation dose of the charged particle beam 10a1b accumulated in the resist considering proximity effect and fogging effect (in square brackets [ ] on the right side of a following equation (2)) in the charged particle beam drawing apparatus 10 of the first embodiment. A following equation (3) shows a function U(x) in the equation (2) in detail.

$$E(x) = K'(U(x), x) \left[ \frac{D(x)}{2} + \eta \int_A D(x')g_P(x-x')dx' + \theta \int_A D(x')g_F(x-x')dx' \right] \quad (2)$$
$$= C$$

$$U(x) = \lambda \int_A g_r(x-x')dx' \quad (3)$$

In detail, the equation (2) shows a relation between the accumulation energy E(x) in a position x on a line extending in x axis direction, of the charged particle beam 10a1b accumulated in the resist, and the accumulation dose of the charged particle beam 10a1b accumulated in the resist considering proximity effect and fogging effect (in square brackets [ ] on the right side of the equation (2)).

In the equation (2), K'(U(x), x) is the conversion coefficient from the accumulation dose of the charged particle beam 10a1b accumulated in the resist (in square brackets [ ] on the right side of the equation (2)) to the accumulation energy E(x) of the charged particle beam 10a1b accumulated in the resist. C is the threshold of the accumulation energy E(x) of the charged particle beam 10a1b accumulated in the resist.

In the equation (2), D(x) shows the dose of the charged particle beam 10a1b applied from the optical column 10a1 to the position x in the resist. A left end portion (D(x)/2) in square brackets [ ] on the right side of the equation (2) shows the accumulation dose of the charged particle beam 10a1b accumulated in the position x in the resist, after the charged particle beam 10a1b is applied from the optical column 10a1 to the position x in the resist. Namely, the equation (2) means that a half (D(x)/2) of the dose D(x) of the charged particle beam 10a1b applied from the optical column 10a1 to the position x in the resist is accumulated in the position x in the resist.

A middle portion in square brackets [ ] on the right side of the equation (2) shows the accumulation dose of the charged particle beam 10a1b accumulated in the position x in the resist by proximity effect, after the charged particle beam 10a1b is applied from the optical column 10a1 to the position x' in the whole drawing area A in the resist. In detail, in the equation (2), $\eta$ shows a proximity effect correction coefficient, and $g_P$ shows a proximity effect influence distribution. In the charged particle beam drawing apparatus 10 of the first embodiment, Gaussian distribution (normal distribution) is used as the proximity effect influence distribution $g_P$.

A right end portion in square brackets [ ] on the right side of the equation (2) shows the accumulation dose of the charged particle beam 10a1b accumulated in the position x in the resist by fogging effect, after the charged particle beam 10a1b is applied from the optical column 10a1 to the position x' in the whole drawing area A in the resist. In detail, in the equation (2), $\theta$ shows a fogging effect correction coefficient, and $g_F$ shows a fogging effect influence distribution. In the charged particle beam drawing apparatus 10 of the first embodiment, Gaussian distribution (normal distribution) is used as the fogging effect influence distribution $g_F$.

In the equation (3), $\lambda$ shows a conversion coefficient changing coefficient (constant), and $g_r$ shows a conversion coefficient changing distribution. In the charged particle beam drawing apparatus 10 of the first embodiment, Gaussian distribution (normal distribution) is used as the conversion coefficient changing distribution $g_r$. A value of the function U(x) in the equation (3) in a position x, around which the pattern density is high, is larger than a value of the function U(x) in the equation (3) in a position x, around which the pattern density is low.

Namely, in the charged particle beam drawing apparatus 10 of the first embodiment, as shown in FIG. 2 and the equations (2) and (3), the conversion coefficient K'(U(x), x) which is the ratio of the accumulation energy E (x) of the charged particle beam 10a1b accumulated in the resist, to the accumulation dose of the charged particle beam 10a1b accumulated in the resist considering proximity effect and fogging effect (in square brackets [ ] on the right side of the equation (2)), is changed by the conversion coefficient changing portion 10b1a2, on the basis of the pattern density and the position x in the resist.

The inventor's studies show that the width W (the vertical axis of the graph in FIG. 6) of the linear pattern PL2 (see FIG. 5) in the positions x3, x4 (see FIGS. 5 and 6) around which the pattern density is high, and the width W (the vertical axis of the graph in FIG. 6) of the linear patterns PL1, PL3 (see FIG. 5) in the positions x1, x6 (see FIGS. 5 and 6) around which the pattern density is low, can be made equal by providing the conversion coefficient K'(U(x), x), wherein the patterns PL1, PL2, PL3 are drawn in the resist of the first type of mask M. The inventor's studies show that the width W (the vertical axis of the graph in FIG. 7) of the linear pattern PL2 (see FIG. 5) in the positions x3, x4 (see FIGS. 5 and 7) around which the pattern density is high, and the width W (the vertical axis of the graph in FIG. 7) of the linear patterns PL1, PL3 (see FIG. 5) in the positions x1, x6 (see FIGS. 5 and 7) around which the pattern density is low, can be made equal by providing the conversion coefficient K'(U(x), x), wherein the patterns PL1, PL2, PL3 are drawn in the resist of the second type of the mask M which is different from the first type of mask M. The inventor's studies show that the width W (the vertical axis of the graph in FIG. 8) of the linear pattern PL2 (see FIG. 5) in the positions x3, x4 (see FIGS. 5 and 8) around which the pattern density is high, and the width W (the vertical axis of the graph in FIG. 8) of the linear patterns PL1, PL3 (see FIG. 5) in the positions x1, x6 (see FIGS. 5 and 8) around which the pattern density is low, can be made equal by providing the conversion coefficient K'(U(x), x), wherein the patterns PL1, PL2, PL3 are drawn in the resist of the third type of the mask M which is different from the first type of mask M.

In detail, in the charged particle beam drawing apparatus 10 of the first embodiment, a function shown in a following equation (4) is used as the conversion coefficient K'(U(x), x) in the equation (2), in order to make the width W (the vertical axis of the graph in FIG. 7) of the linear patterns PL1, PL2, PL3 (see FIG. 5) drawn in the resist of the second type of mask M, uniform. In the charged particle beam drawing apparatus 10 of the first embodiment, a function shown in a following equation (5) is used as the conversion coefficient K'(U(x), x) in the equation (2), in order to make the width W (the vertical axis of the graph in FIG. 8) of the linear patterns PL1, PL2, PL3 (see FIG. 5) drawn in the resist of the third type of mask M, uniform.

$$K' = K \times \exp(U^2(x)) \quad (4)$$

$$K' = K \times \exp(-\sqrt{U(x)}) \quad (5)$$

In the equations (4) and (5), K shows a constant. If the second type of mask M is applied to the charged particle beam drawing apparatus 10 of the first embodiment, fogging effect correction coefficient $\theta$ is 0.07, a standard deviation $\sigma_F$ of the fogging effect influence distribution $g_F$ is 1.5 cm, the conversion coefficient changing coefficient $\lambda$ is 0.35, and a standard deviation $\sigma_r$ of the conversion coefficient changing distribution $g_r$ is 7.0 mm, for example. If the third type of mask M is applied to the charged particle beam drawing apparatus 10 of the first embodiment, fogging effect correction coefficient θ is 0.07, the standard deviation $\sigma_F$ of the fogging effect influence distribution $g_F$ is 1.5 cm, the conversion coefficient changing coefficient λ is 0.025, and the standard deviation $\sigma_r$ of the conversion coefficient changing distribution $g_r$ is 7.0 mm, for example.

In the charged particle beam drawing apparatus 10 of the first embodiment, as shown in FIG. 2, the charged particle beam dose correction portion 10b1a has a fogging effect correction dose calculation portion 10b1a1 for correcting the dose of the charged particle beam 10a1b (see FIG. 1) applied from the optical column 10a1 (see FIG. 1) to the resist on the basis of fogging effect. The fogging effect correction dose calculation portion 10b1a1 includes a proximity effect correction function for correcting the dose of the charged particle beam 10a1b (see FIG. 1) applied from the optical column 10a1 (see FIG. 1) to the resist on the basis of proximity effect.

In detail, in the charged particle beam drawing apparatus 10 of the first embodiment, the dose of the charged particle beam 10a1b (see FIG. 1) applied from the optical column 10a1 (see FIG. 1) to the resist is corrected on the basis of fogging effect, and a fogging effect correction dose F(x) is calculated on the basis of a following equation (6), by the fogging effect correction dose calculation portion 10b1a1 (see FIG. 2).

$$F(x) = \sum_{n=1}^{j} f_n(x) \qquad (6)$$

In the charged particle beam drawing apparatus 10 of the first embodiment, as shown in the equation (6), the fogging effect correction dose F(x) is calculated by adding correction amount $f_n(x)$, where n ranges from 1 to infinity, by means of the fogging effect correction dose calculation portion 10b1a1 (see FIG. 2). In detail, correction amount $f_1(x)$ is shown in a following equation (7), and correction amount $f_2(x)$ is shown in a following equation (8). Correction amount $\rho^+(x')$ in the equations (7) and (8) is shown in a following equation (9), and correction coefficient ζ in the equations (7) and (8) is shown in a following equation (10). Namely, in the charged particle beam drawing apparatus 10 of the first embodiment, numerator of the right side of the equation (7) is not 1, but K/K'(U(x), x).

$$f_1(x) = \frac{1 \to \boxed{\dfrac{K}{K'(x)}}}{1 + \zeta \int g_F(x-x')\rho'(x')dx'} \qquad (7)$$

$$f_n(x) = \frac{\zeta \left\{ \begin{array}{l} f_{n+1}(x) \int g_F(x-x')\rho'(x')dx' - \\ \int f_{n+1}(x')g_F(x-x')\rho'(x')dx' \end{array} \right\}}{1 + \zeta \int g_F(x-x')\rho'(x')dx'} \qquad (8)$$

$$\rho^+(x') = \sum_{\text{small region } P} d(x_{l,j})\rho(x_{l,j})\Delta_P^2/\Delta_F^2 \qquad (9)$$

$$\zeta = \frac{\theta}{\dfrac{1}{2} + \eta} \qquad (10)$$

In the charged particle beam drawing apparatus 10 of the first embodiment, correction amount $d(x_{l,j})$ (see the equation (9)) is included in correction amount $\rho^+(x')$ in the equations (7) and (8), wherein correction amount $d(x_{l,j})$ corresponds to correction amount for correcting the dose of the charged particle beam 10a1b (see FIG. 1) applied from the optical column 10a1 (see FIG. 1) to the resist on the basis of proximity effect.

In the equation (9), small region P shows a plurality of proximity effect correction meshes (see paragraph 0006 of Japanese Unexamined Patent Publication No. 2007-220728) which correspond to a fogging effect correction mesh (see paragraph 0006 of Japanese Unexamined Patent Publication No. 2007-220728). $\rho(x_{l,j})$ shows pattern density in the resist. $\Delta_P^2$ shows an area of one proximity effect correction mesh. $\Delta_F^2$ shows an area of one fogging effect correction mesh.

Namely, in the charged particle beam drawing apparatus described in Japanese Unexamined Patent Publication No. 2007-220728, the fogging effect correction dose is calculated on the basis of an equation 15 of Japanese Unexamined Patent Publication No. 2007-220728, and the proximity effect correction dose is calculated on the basis of equations 3, 4 of Japanese Unexamined Patent Publication No. 2007-220728. That is, in the charged particle beam drawing apparatus described in Japanese Unexamined Patent Publication No. 2007-220728, calculation of the proximity effect correction dose is independent of calculation of the fogging effect correction dose. Then, in the charged particle beam drawing apparatus described in Japanese Unexamined Patent Publication No. 2007-220728, the correction dose of the charged particle beam applied from the optical column to the resist is calculated by multiplying the proximity effect correction dose by the fogging effect correction dose (see the equation 2 of Japanese Unexamined Patent Publication No. 2007-220728).

In the charged particle beam drawing apparatus 10 of the first embodiment, as shown in the equations (6) to (10), the fogging effect correction dose F(x) is calculated by the fogging effect correction dose calculation portion 10b1a1 (see FIG. 2). Then, in the charged particle beam drawing apparatus 10 of the first embodiment, the dose D(x) (see the equation (2)) of the charged particle beam 10a1b (see FIG. 1) applied from the optical column 10a1 (see FIG. 1) to the position x in the resist considering proximity effect and fogging effect, is calculated by the charged particle beam dose correction portion 10b1a (see FIG. 2), on the basis of the fogging effect correction dose F(x), a proximity effect correction dose d(x), the base dose (see paragraph 0085 of Japanese Unexamined Patent Publication No. 2007-220728), and a following equation (11).

$$D(x) = d(x)F(x) \times (\text{base dose}) \qquad (11)$$

In detail, in the charged particle beam drawing apparatus 10 of the first embodiment, the proximity effect correction dose d(x) in the equation (11) is calculated on the basis of the equations 3, 4 of Japanese Unexamined Patent Publication No. 2007-220728.

As mentioned above, in the charged particle beam drawing apparatus 10 of the first embodiment, even if different type of mask M, such as the first type of mask M, the second type of mask M, and the third type of mask M is applied to the charged particle beam drawing apparatus 10 of the first embodiment, the critical dimension uniformity of each type of mask M can be improved. In detail, in the charged particle beam drawing apparatus 10 of the first embodiment, the critical dimension uniformity of each type of mask M can be improved by changing the conversion coefficient K'(U(x), x)

which is the ratio of the accumulation energy E(x) of the charged particle beam 10$a$1$b$ accumulated in the resist, to the accumulation dose of the charged particle beam 10$a$1$b$ accumulated in the resist (in square brackets [ ] on the right side of the equation (2)), rather than the charged particle beam drawing apparatus in which the conversion coefficient is not changed, but is constant. In other words, in the charged particle beam drawing apparatus 10 of the first embodiment, even if different type of masks M are applied to the charged particle beam drawing apparatus 10 of the first embodiment, proximity effect and fogging effect which occur in respective masks M, can be accurately corrected.

In the charged particle beam drawing apparatus 10 of the first embodiment, loading effect (see paragraph 0004 of Japanese Unexamined Patent Publication No. 2007-220728) is not corrected, but proximity effect and fogging effect are corrected. In the charged particle beam drawing apparatus 10 of a third embodiment, proximity effect and fogging effect are corrected as well as in the charged particle beam drawing apparatus 10 of the first embodiment, and loading effect is corrected.

In detail, in the charged particle beam drawing apparatus 10 of the third embodiment, the conversion coefficient changing portion 10$b$1$a$2 (see FIG. 2) includes a conversion coefficient changing function for changing the conversion coefficient which is the ratio of the accumulation energy E(x) of the charged particle beam 10$a$1$b$ accumulated in the resist, to the accumulation dose of the charged particle beam 10$a$1$b$ accumulated in the resist (in square brackets [ ] on the right side of the equation (2)), on the basis of critical dimension variation $\Delta$CD caused by loading effect.

Namely, in the charged particle beam drawing apparatus 10 of the first embodiment, the conversion coefficient which is the ratio of the accumulation energy E(x) of the charged particle beam 10$a$1$b$ accumulated in the resist, to the accumulation dose of the charged particle beam 10$a$1$b$ accumulated in the resist (in square brackets [ ] on the right side of the equation (2)), is "K'(U(x), x)". In the charged particle beam drawing apparatus 10 of the third embodiment, the conversion coefficient which is the ratio of the accumulation energy E(x) of the charged particle beam 10$a$1$b$ accumulated in the resist, to the accumulation dose of the charged particle beam 10$a$1$b$ accumulated in the resist (in square brackets [ ] on the right side of the equation (2)), is "exp($\Delta$CD/a(d(x)))×K'(U(x), x)". The "a(d(x))" is a value which depends on proximity effect correction dose (or pattern density).

In other words, if critical dimension variation LCD caused by loading effect is zero, the value of "exp($\Delta$CD/a(d(x)))" is 1, therefore, the value of the conversion coefficient "exp ($\Delta$CD/a(d(x)))×K'(U(x), x)" in the charged particle beam drawing apparatus 10 of the third embodiment, is equal to the value of the conversion coefficient K'(U(x), x) in the charged particle beam drawing apparatus 10 of the first embodiment.

If critical dimension variation LCD caused by loading effect is not zero, the value of "exp($\Delta$CD/a(d(x)))" is not equal to 1, therefore, the value of the conversion coefficient "exp($\Delta$CD/a(d(x)))×k'(U(x), x)" in the charged particle beam drawing apparatus 10 of the third embodiment, is not equal to the value of the conversion coefficient K'(U(x), x) in the charged particle beam drawing apparatus 10 of the first embodiment.

Namely, in the charged particle beam drawing apparatus 10 of the third embodiment, even if different type of mask M is applied to the charged particle beam drawing apparatus 10 of the third embodiment, proximity effect, fogging effect and loading effect which occur in each mask M, can be accurately corrected. In detail, in the charged particle beam drawing apparatus described in Japanese Unexamined Patent Publication No. 2007-258659, the correction dose of the charged particle beam applied from the optical column to the resist is calculated by multiplying the proximity effect correction dose, the fogging effect correction dose and the loading effect correction dose (see an equation 9 of Japanese Unexamined Patent Publication No. 2007-258659), wherein the proximity effect correction dose, the fogging effect correction dose and the loading effect correction dose are independently calculated. In the charged particle beam drawing apparatus 10 of the third embodiment, the proximity effect correction dose, the fogging effect correction dose and the loading effect correction dose are not independently calculated, but as mentioned above, the conversion coefficient which is the ratio of the accumulation energy E(x) of the charged particle beam 10$a$1$b$ accumulated in the resist, to the accumulation dose of the charged particle beam 10$a$1$b$ accumulated in the resist (in square brackets [ ] on the right side of the equation (2)), is changed on the basis of critical dimension variation (CD error) $\Delta$CD caused by loading effect.

Consequently, in the charged particle beam drawing apparatus 10 of the third embodiment, adjusting the accumulation dose of the charged particle beam 10$a$1$b$ accumulated in the resist (in square brackets [ ] on the right side of the equation (2)) can be simplified, and correction accuracy of proximity effect, fogging effect and loading effect can be easily improved, rather than the charged particle beam drawing apparatus described in Japanese Unexamined Patent Publication No. 2007-258659, wherein the proximity effect correction dose, the fogging effect correction dose and the loading effect correction dose are independently calculated, and wherein the correction dose of the charged particle beam applied from the optical column to the resist is calculated by multiplying the proximity effect correction dose, the fogging effect correction dose and the loading effect correction dose.

In the charged particle beam drawing apparatus 10 of the third embodiment, critical dimension variation which is independent of pattern density and depends on a position x in the mask M where patterns are drawn, is not corrected, but proximity effect, fogging effect and loading effect which mainly depend on the density of patterns drawn in the resist of the mask M, are corrected. In the charged particle beam drawing apparatus 10 of a forth embodiment, proximity effect, fogging effect and loading effect which mainly depend on the density of patterns drawn in the resist of the mask M, are corrected as well as in the charged particle beam drawing apparatus 10 of the third embodiment, and critical dimension variation which is independent of pattern density and depends on a position x in the mask M where patterns are drawn, is corrected, wherein the critical dimension variation is caused by development process of the mask M. Critical dimension variation depending on a position in the mask where patterns are drawn and caused by development process of the mask M is described in paragraph 0041 of Japanese Unexamined Patent Publication No. 2007-150243.

In detail, as shown in FIG. 9 of Japanese Unexamined Patent Publication No. 2007-150243, regardless of the density of patterns drawn in the resist of the mask M by the charged particle beam 10$a$1$b$, the width of patterns drawn in the resist of the peripheral portion of the mask M has a tendency to be larger than the width of patterns drawn in the resist of the central portion of the mask M, under the influence of the development process of the mask M.

Considering dependence of position, in the charged particle beam drawing apparatus 10 of the forth embodiment, the conversion coefficient changing portion 10$b$1$a$2 (see FIG. 2) includes a conversion coefficient changing function for changing the conversion coefficient which is the ratio of the accumulation energy E(x) of the charged particle beam 10a1b accumulated in the resist, to the accumulation dose of the charged particle beam 10a1b accumulated in the resist (in square brackets [ ] on the right side of the equation (2)), on the basis of the position x in the resist of the mask M.

Namely, in the charged particle beam drawing apparatus 10 of the third embodiment, the conversion coefficient which is the ratio of the accumulation energy E(x) of the charged particle beam 10a1b accumulated in the resist, to the accumulation dose of the charged particle beam 10a1b accumulated in the resist (in square brackets [ ] on the right side of the equation (2)), is "exp($\Delta$CD/a(d(x)))×K'(U(x), x)". In the charged particle beam drawing apparatus 10 of the forth embodiment, the conversion coefficient which is the ratio of the accumulation energy E(x) of the charged particle beam 10a1b accumulated in the resist, to the accumulation dose of the charged particle beam 10a1b accumulated in the resist (in square brackets [ ] on the right side of the equation (2)), is "exp($\Delta$CD/a(d(x)))×(K'(U(x), x)+$\gamma$(x))".

In detail, in the charged particle beam drawing apparatus 10 of the forth embodiment, a value of the function $\gamma$(x) in a position x in the resist of the central portion of the mask M, is zero, and a value of the function $\gamma$(x) in a position x in the resist of the peripheral portion of the mask M, is larger than zero. In detail, a position dependence map which shows a relation between the position x in the resist of the mask M and the value of the function $\gamma$(x), is formed.

Accordingly, in the position x in the resist of the central portion of the mask M, the value of the conversion coefficient "exp($\Delta$CD/a(d(x)))×(K'(U(x), x)+$\gamma$(x))" in the charged particle beam drawing apparatus 10 of the forth embodiment, is equal to the value of the conversion coefficient "exp($\Delta$CD/a(d(x)))×K'(U(x), x)" in the charged particle beam drawing apparatus 10 of the third embodiment. In the position x in the resist of the peripheral portion of the mask M, the value of the function $\gamma$(x) is plus, therefore the value of the conversion coefficient "exp($\Delta$CD/a(d(x)))×(K'(U(x), x)+$\gamma$(x))" in the charged particle beam drawing apparatus 10 of the forth embodiment, is larger than the value of the conversion coefficient "exp($\Delta$CD/a(d(x)))×K'(U(x), x)" in the charged particle beam drawing apparatus 10 of the third embodiment. Consequently, the dose D(x) (see the equation (2)) of the charged particle beam 10a1b applied from the optical column 10a1 to the position x in the resist of the peripheral portion of the mask M in the charged particle beam drawing apparatus 10 of the forth embodiment, is smaller than the dose D(x) (see the equation (2)) of the charged particle beam 10a1b applied from the optical column 10a1 to the position x in the resist of the peripheral portion of the mask M in the charged particle beam drawing apparatus 10 of the third embodiment.

Namely, in the charged particle beam drawing apparatus 10 of the forth embodiment, not only the conversion coefficient is changed on the basis of both of the pattern density in the resist and the position x in the resist, but also the conversion coefficient is changed on the basis of the position x in the resist, regardless of the pattern density in the resist. In detail, in the charged particle beam drawing apparatus 10 of the forth embodiment, the conversion coefficient is changed on the basis of only the position x in the resist, in order to reduce the critical dimension variation (CD error) caused by only the position x in the resist, regardless of the pattern density in the resist.

Consequently, in the charged particle beam drawing apparatus 10 of the forth embodiment, the critical dimension variation (CD error) caused by only the position x in the resist can be reduced, rather than the charged particle beam drawing apparatus wherein the conversion coefficient which is the ratio of the accumulation energy E(x) of the charged particle beam 10a1b accumulated in the resist, to the accumulation dose of the charged particle beam 10a1b accumulated in the resist (in square brackets [ ] on the right side of the equation (2)), is not changed on the basis of only the position x in the resist.

In the charged particle beam drawing apparatus 10 of the third embodiment, critical dimension variation which is independent of pattern density and depends on a position x in the mask M where patterns are drawn, is not corrected, but proximity effect, fogging effect and loading effect which mainly depend on the density of patterns drawn in the resist of the mask M, are corrected. In the charged particle beam drawing apparatus 10 of a fifth embodiment, proximity effect, fogging effect and loading effect which mainly depend on the density of patterns drawn in the resist of the mask M, are corrected as well as in the charged particle beam drawing apparatus 10 of the third embodiment, and critical dimension variation which is independent of pattern density and depends on a position x in the mask M where patterns are drawn, is corrected, wherein the critical dimension variation is caused by development process of the mask M.

In detail, in the charged particle beam drawing apparatus 10 of the fifth embodiment, the conversion coefficient changing portion 10b1a2 (see FIG. 2) includes a conversion coefficient changing function for changing the conversion coefficient which is the ratio of the accumulation energy E(x) of the charged particle beam 10a1b accumulated in the resist, to the accumulation dose of the charged particle beam 10a1b accumulated in the resist (in square brackets [ ] on the right side of the equation (2)), on the basis of the position x in the resist of the mask M.

Namely, in the charged particle beam drawing apparatus 10 of the third embodiment, the conversion coefficient which is the ratio of the accumulation energy E(x) of the charged particle beam 10a1b accumulated in the resist, to the accumulation dose of the charged particle beam 10a1b accumulated in the resist (in square brackets [ ] on the right side of the equation (2)), is "exp($\Delta$CD/a(d(x)))×K'(U(x), x)". In the charged particle beam drawing apparatus 10 of the fifth embodiment, the conversion coefficient which is the ratio of the accumulation energy E(x) of the charged particle beam 10a1b accumulated in the resist, to the accumulation dose of the charged particle beam 10a1b accumulated in the resist (in square brackets [ ] on the right side of the equation (2)), is "exp($\Delta$CD/a(d(x)))×(K'(U(x), x)×$\beta$(x))".

In detail, in the charged particle beam drawing apparatus 10 of the fifth embodiment, a value of the function $\beta$(x) in a position x in the resist of the central portion of the mask M, is 1, and a value of the function $\beta$(x) in a position x in the resist of the peripheral portion of the mask M, is larger than 1. In detail, a position dependence map which shows a relation between the position x in the resist of the mask M and the value of the function $\beta$(x), is formed.

Accordingly, in the position x in the resist of the central portion of the mask M, the value of the conversion coefficient "exp($\Delta$CD/a(d(x)))×(K'(U(x), x)×$\beta$(x))" in the charged particle beam drawing apparatus 10 of the fifth embodiment, is equal to the value of the conversion coefficient "exp($\Delta$CD/a(d(x)))×K'(U(x), x)" in the charged particle beam drawing apparatus 10 of the third embodiment. In the position x in the resist of the peripheral portion of the mask M, the value of the function $\beta$(x) is larger than 1, therefore the value of the conversion coefficient "exp($\Delta$CD/a(d(x)))×(K'(U(x), x)×$\beta$(x))" in the charged particle beam drawing apparatus 10 of the fifth embodiment, is larger than the value of the conversion coefficient "exp(ΔCD/a(d(x)))×K'(U(x), x)" in the charged particle beam drawing apparatus 10 of the third embodiment. Consequently, the dose D(x) (see the equation (2)) of the charged particle beam 10a1b applied from the optical column 10a1 to the position x in the resist of the peripheral portion of the mask M in the charged particle beam drawing apparatus 10 of the fifth embodiment, is smaller than the dose D(x) (see the equation (2)) of the charged particle beam 10a1b applied from the optical column 10a1 to the position x in the resist of the peripheral portion of the mask M in the charged particle beam drawing apparatus 10 of the third embodiment.

Namely, in the charged particle beam drawing apparatus 10 of the fifth embodiment, not only the conversion coefficient is changed on the basis of both of the pattern density in the resist and the position x in the resist, but also the conversion coefficient is changed on the basis of the position x in the resist, regardless of the pattern density in the resist. In detail, in the charged particle beam drawing apparatus 10 of the fifth embodiment, the conversion coefficient is changed on the basis of only the position x in the resist, in order to reduce the critical dimension variation (CD error) caused by only the position x in the resist, regardless of the pattern density in the resist.

Consequently, in the charged particle beam drawing apparatus 10 of the fifth embodiment, the critical dimension variation (CD error) caused by only the position x in the resist can be reduced, rather than the charged particle beam drawing apparatus wherein the conversion coefficient which is the ratio of the accumulation energy E(x) of the charged particle beam 10a1b accumulated in the resist, to the accumulation dose of the charged particle beam 10a1b accumulated in the resist (in square brackets [ ] on the right side of the equation (2)), is not changed on the basis of only the position x in the resist.

In the charged particle beam drawing apparatus 10 of the third embodiment, critical dimension variation which is independent of pattern density and depends on a position x in the mask M where patterns are drawn, is not corrected, but proximity effect, fogging effect and loading effect which mainly depend on the density of patterns drawn in the resist of the mask M, are corrected. In the charged particle beam drawing apparatus 10 of a sixth embodiment, proximity effect, fogging effect and loading effect which mainly depend on the density of patterns drawn in the resist of the mask M, are corrected as well as in the charged particle beam drawing apparatus 10 of the third embodiment, and critical dimension variation which is independent of pattern density and depends on a position x in the mask M where patterns are drawn, is corrected, wherein the critical dimension variation is caused by Cr etching process of the mask M. Critical dimension variation depending on a position in the mask where patterns are drawn and caused by Cr etching process of the mask M is described in paragraph 0041 of Japanese Unexamined Patent Publication No. 2007-150243.

In detail, as shown in FIG. 9 of Japanese Unexamined Patent Publication No. 2007-150243, regardless of the density of patterns drawn in the resist of the mask M by the charged particle beam 10a1b, the width of patterns drawn in the resist of the peripheral portion of the mask M has a tendency to be larger than the width of patterns drawn in the resist of the central portion of the mask M, under the influence of the Cr etching process of the mask M.

Considering dependence of position, in the charged particle beam drawing apparatus 10 of the sixth embodiment, the conversion coefficient changing portion 10b1a2 (see FIG. 2) includes a conversion coefficient changing function for changing the conversion coefficient which is the ratio of the accumulation energy E(x) of the charged particle beam 10a1b accumulated in the resist, to the accumulation dose of the charged particle beam 10a1b accumulated in the resist (in square brackets [ ] on the right side of the equation (2)), on the basis of the position x in the resist of the mask M.

Namely, in the charged particle beam drawing apparatus 10 of the third embodiment, the conversion coefficient which is the ratio of the accumulation energy E(x) of the charged particle beam 10a1b accumulated in the resist, to the accumulation dose of the charged particle beam 10a1b accumulated in the resist (in square brackets [ ] on the right side of the equation (2)), is "exp(ΔCD/a(d(x)))×K'(U(x), x)". In the charged particle beam drawing apparatus 10 of the sixth embodiment, the conversion coefficient which is the ratio of the accumulation energy E(x) of the charged particle beam 10a1b accumulated in the resist, to the accumulation dose of the charged particle beam 10a1b accumulated in the resist (in square brackets [ ] on the right side of the equation (2)), is "exp((ΔCD+P(x))/a(d(x)))×K'(U(x), x)".

In detail, in the charged particle beam drawing apparatus 10 of the sixth embodiment, a value of the function P(x) in a position x in the resist of the central portion of the mask M, is zero, and a value of the function P(x) in a position x in the resist of the peripheral portion of the mask M, is larger than zero. In detail, a position dependence map which shows a relation between the position x in the resist of the mask M and the value of the function P(x), is formed.

Accordingly, in the position x in the resist of the central portion of the mask M, the value of the conversion coefficient "exp((ΔCD+P(x))/a(d(x)))×K'(U(x), x)" in the charged particle beam drawing apparatus 10 of the sixth embodiment, is equal to the value of the conversion coefficient "exp(ΔCD/a(d(x)))×K'(U(x), x)" in the charged particle beam drawing apparatus 10 of the third embodiment. In the position x in the resist of the peripheral portion of the mask M, the value of the function P(x) is plus, therefore the value of the conversion coefficient "exp((ΔCD+P(x))/a(d(x)))×K'(U(x), x)" in the charged particle beam drawing apparatus 10 of the sixth embodiment, is larger than the value of the conversion coefficient "exp(LCD/a(d(x)))×K'(U(x), x)" in the charged particle beam drawing apparatus 10 of the third embodiment. Consequently, the dose D(x) (see the equation (2)) of the charged particle beam 10a1b applied from the optical column 10a1 to the position x in the resist of the peripheral portion of the mask M in the charged particle beam drawing apparatus 10 of the sixth embodiment, is smaller than the dose D(x) (see the equation (2)) of the charged particle beam 10a1b applied from the optical column 10a1 to the position x in the resist of the peripheral portion of the mask M in the charged particle beam drawing apparatus 10 of the third embodiment.

Namely, in the charged particle beam drawing apparatus 10 of the sixth embodiment, not only the conversion coefficient is changed on the basis of both of the pattern density in the resist and the position x in the resist, but also the conversion coefficient is changed on the basis of the position x in the resist, regardless of the pattern density in the resist. In detail, in the charged particle beam drawing apparatus 10 of the sixth embodiment, the conversion coefficient is changed on the basis of only the position x in the resist, in order to reduce the critical dimension variation (CD error) caused by only the position x in the resist, regardless of the pattern density in the resist.

Consequently, in the charged particle beam drawing apparatus 10 of the sixth embodiment, the critical dimension variation (CD error) caused by only the position x in the resist can be reduced, rather than the charged particle beam drawing apparatus wherein the conversion coefficient which is the ratio of the accumulation energy E(x) of the charged particle beam 10a1b accumulated in the resist, to the accumulation dose of the charged particle beam 10a1b accumulated in the resist (in square brackets [ ] on the right side of the equation (2)), is not changed on the basis of only the position x in the resist.

In the charged particle beam drawing apparatus 10 of the seventh embodiment, above mentioned first to sixth embodiments are appropriately combined.

As many apparently widely different embodiments of this invention may be made without departing from the spirit and scope thereof, it is to be understood that the invention is not limited to the specific embodiments thereof except as defined in the appended claims.

What is claimed is:

1. A charged particle beam drawing apparatus, comprising:
a drawing chamber including a movable stage which supports a mask, the mask being formed by applying a resist to an upper surface of a mask substrate;
an optical column for applying a charged particle beam to draw patterns in the resist;
a charged particle beam dose correction portion for correcting a dose of the charged particle beam applied from the optical column to the resist on the basis of proximity effect and fogging effect; and
a conversion coefficient changing portion for changing a conversion coefficient on the basis of pattern density in the resist and a position in the resist, wherein the conversion coefficient is a ratio of an accumulation energy of the charged particle beam accumulated in the resist, to an accumulation dose of the charged particle beam accumulated in the resist.

2. The charged particle beam drawing apparatus according to claim 1, wherein different functions are used as the conversion coefficient for different type of masks in the conversion coefficient changing portion.

3. The charged particle beam drawing apparatus according to claim 1, further comprising a fogging effect correction dose calculation portion for correcting the dose of the charged particle beam applied from the optical column to the resist on the basis of fogging effect, wherein the fogging effect correction dose calculation portion includes a proximity effect correction function for correcting the dose of the charged particle beam applied from the optical column to the resist on the basis of proximity effect.

4. The charged particle beam drawing apparatus according to claim 1, wherein the conversion coefficient changing portion includes a conversion coefficient changing function for changing the conversion coefficient which is the ratio of the accumulation energy of the charged particle beam accumulated in the resist, to the accumulation dose of the charged particle beam accumulated in the resist, on the basis of critical dimension variation caused by loading effect.

5. The charged particle beam drawing apparatus according to claim 1, wherein the conversion coefficient changing portion includes a conversion coefficient changing function for changing the conversion coefficient which is the ratio of the accumulation energy of the charged particle beam accumulated in the resist, to the accumulation dose of the charged particle beam accumulated in the resist, on the basis of a position in the resist.

6. A charged particle beam drawing method, for drawing patterns in a resist of a mask by applying a charged particle beam from an optical column to the resist of the mask, the mask being formed by applying the resist to an upper surface of a mask substrate, comprising:
placing the mask on a movable stage in a drawing chamber; and
changing a conversion coefficient which is a ratio of an accumulation energy of the charged particle beam accumulated in the resist, to an accumulation dose of the charged particle beam accumulated in the resist, on the basis of pattern density in the resist and a position in the resist, by correcting the dose of the charged particle beam applied from the optical column to the resist on the basis of proximity effect and fogging effect.

7. The charged particle beam drawing method according to claim 6, wherein different functions are used as the conversion coefficient for different type of masks.

8. The charged particle beam drawing method according to claim 6, further comprising:
correcting the dose of the charged particle beam applied from the optical column to the resist on the basis of fogging effect, by means of a fogging effect correction dose calculation portion; and
correcting the dose of the charged particle beam applied from the optical column to the resist on the basis of proximity effect, by means of the fogging effect correction dose calculation portion.

9. The charged particle beam drawing method according to claim 6, wherein the conversion coefficient which is the ratio of the accumulation energy of the charged particle beam accumulated in the resist, to the accumulation dose of the charged particle beam accumulated in the resist, is changed on the basis of critical dimension variation caused by loading effect.

10. The charged particle beam drawing method according to claim 6, wherein the conversion coefficient which is the ratio of the accumulation energy of the charged particle beam accumulated in the resist, to the accumulation dose of the charged particle beam accumulated in the resist, is changed on the basis of a position in the resist.

* * * * *